United States Patent
Tanaka

(10) Patent No.: US 9,595,488 B2
(45) Date of Patent: Mar. 14, 2017

(54) SEMICONDUCTOR DEVICE

(71) Applicant: J-DEVICES CORPORATION, Oita (JP)

(72) Inventor: Yoshihiro Tanaka, Fukui (JP)

(73) Assignee: J-Devices Corporation, Oita (JP)

( * ) Notice: Subject to any disclaimer, the term of this patent is extended or adjusted under 35 U.S.C. 154(b) by 0 days.

(21) Appl. No.: 15/010,988

(22) Filed: Jan. 29, 2016

(65) Prior Publication Data

US 2016/0225701 A1 Aug. 4, 2016

(30) Foreign Application Priority Data

Jan. 30, 2015 (JP) .................. 2015-016500

(51) Int. Cl.
*H01L 23/52* (2006.01)
*H01L 29/40* (2006.01)
*H01L 23/48* (2006.01)
*H01L 23/495* (2006.01)
*H01L 23/498* (2006.01)

(Continued)

(52) U.S. Cl.
CPC .. *H01L 23/49513* (2013.01); *H01L 23/49582* (2013.01); *H01L 23/49861* (2013.01); *H01L 24/29* (2013.01); *H01L 24/83* (2013.01); *H01L 25/50* (2013.01); *H01L 24/32* (2013.01); *H01L 24/48* (2013.01); *H01L 2224/26175* (2013.01); *H01L 2224/291* (2013.01); *H01L 2224/29011* (2013.01); *H01L 2224/29014* (2013.01); *H01L 2224/29015* (2013.01); *H01L 2224/2919* (2013.01); *H01L 2224/29078* (2013.01); *H01L 2224/32245* (2013.01); *H01L 2224/48091* (2013.01); *H01L 2224/48105* (2013.01); *H01L 2224/48227* (2013.01); *H01L 2224/48247* (2013.01); *H01L 2224/73265* (2013.01); *H01L 2224/83048* (2013.01); *H01L 2224/83192* (2013.01); *H01L 2224/83385* (2013.01); *H01L 2224/83439* (2013.01); *H01L 2224/83815* (2013.01); *H01L 2224/92247* (2013.01);

(Continued)

(58) Field of Classification Search
CPC . H01L 2224/16225; H01L 2924/01047; H01L 2924/014; H01L 2224/83; H01L 23/49838; H01L 23/488
USPC ..................... 257/782, 783, 779
See application file for complete search history.

(56) References Cited

U.S. PATENT DOCUMENTS 6,528,889 B1 * 3/2003 Matsuhira ............ H01L 21/563
174/260
2003/0038366 A1 * 2/2003 Kozono ............... H01L 23/3128
257/723

(Continued)

FOREIGN PATENT DOCUMENTS

JP H08172154 A 7/1996
JP 2006303216 A 11/2006

(Continued)

Primary Examiner — S. V. Clark
(74) Attorney, Agent, or Firm — Typha IP LLC

(57) ABSTRACT

A semiconductor device according to one embodiment of the present invention includes a semiconductor element, an island having a surface on which the semiconductor element is fixed using a first metal, and a first pattern formed by a second metal, the first pattern being arranged on one part of the surface, wherein the second metal has a greater wetting characteristic than the surface when the first metal is melted.

11 Claims, 9 Drawing Sheets

(51) Int. Cl.
  *H01L 23/00* (2006.01)
  *H01L 25/00* (2006.01)
(52) U.S. Cl.
  CPC ............... *H01L 2924/00015* (2013.01); *H01L 2924/181* (2013.01)

(56) References Cited

U.S. PATENT DOCUMENTS

2011/0275177 A1* 11/2011 Yim .................... H01L 25/0655
                                                         438/108
2011/0291303 A1* 12/2011 Ikenaga .............. H01L 21/4828
                                                         257/783

FOREIGN PATENT DOCUMENTS

| JP | 2008294172 A | 12/2008 |
| JP | 2012104709 A | 5/2012 |
| JP | 2012125786 A | 7/2012 |

* cited by examiner

SEMICONDUCTOR DEVICE

CROSS REFERENCE TO RELATED APPLICATIONS

This application is based on and claims the benefit of priority from the prior Japanese Patent Application No. 2015-016500, filed on Jan. 30, 2015, the entire contents of which are incorporated herein by reference.

FIELD

The present invention relates to a semiconductor device in which a pattern is formed on a placing section (i.e. an island) where a semiconductor element is to be placed.

BACKGROUND

Researches and developments are advancing with regards to the method for mounting a semiconductor element. In particular, a lead frame package that uses a lead frame is known as one type of mounting of placing the semiconductor element on the lead frame. When using such lead frame package, in particular, when installing and fixing a power semiconductor element on an island of the lead frame, a method using solder is known (refer e.g., Japanese Laid-Open Patent Publication No. H8-172154, Japanese Laid-Open Patent Publication No. 2006-303216, Japanese Laid-Open Patent Publication No. 2008-294172, Japanese Laid-Open Patent Publication No. 2012-104709, Japanese Laid-Open Patent Publication No. 2012-125786).

When fixing the semiconductor element on the island using the solder, molten solder is arranged on the island and the semiconductor element is arranged on the molten solder. It was difficult in this case to control the flowing direction and the spreading manner of the molten solder. Thus, there are possibilities of the solder flowing out from the island, contamination occurring, or defect of electrical characteristics occurring.

SUMMARY

A semiconductor device according to one embodiment of the present invention includes a semiconductor element; an island having a surface on which the semiconductor element is fixed using a first metal; and a first pattern formed by a second metal, the first pattern being arranged on one part of the surface, wherein the second metal has a greater wetting characteristic than the surface when the first metal is melted.

The first metal may be a solder, and the second metal may be a silver.

The first pattern may be formed by plating the second metal.

The first pattern may have a radial shape in which a plurality of rectangular patterns or linear patterns is intersected while differing directions.

The first pattern may be a pattern in which a position where the plurality of rectangular patterns or linear patterns intersects is offset from a center of the island.

The first pattern may have the plurality of rectangular patterns or the linear patterns intersected at a plurality of positions while differing directions.

The first pattern may include a plurality of patterns of different shapes.

The first pattern may include an L-shaped pattern and a square or rectangular pattern.

The first pattern may include a plurality of circular patterns.

The first pattern may be a pattern in which a length of a liner segment joining a center of a certain circular pattern and that of another circular pattern which is arranged adjacent to the certain circular pattern and a length of another liner segment joining the center of the certain circular pattern and that of still another circular pattern which is arranged adjacent to the certain circular pattern are the same, and so that extension lines of the two liner segments are intersect other than the 90 degrees.

The semiconductor device may further include a second pattern made from the second metal that surrounds the first pattern.

According to the present invention, the flowing direction and the spreading manner of the molten solder are controlled when manufacturing the semiconductor device, so that occurrence of defects, and the like can be prevented.

DESCRIPTION OF EMBODIMENTS

In light of the foregoing problems, the present invention provides a semiconductor device in which a semiconductor element is placed while controlling the flowing direction and the spreading manner of the molten solder.

A plurality of embodiments will be described for the mode for carrying out the present invention. The present invention is not limited to the embodiments described below, and the embodiments described below may be carried out with various modifications, and the like made thereon. The modes in which the modifications and the like are made are also encompassed within the technical scope of the present invention. In the figures, the vertical and horizontal scales may be different from the implemented article of the present invention.

First Embodiment

Figure 1A:
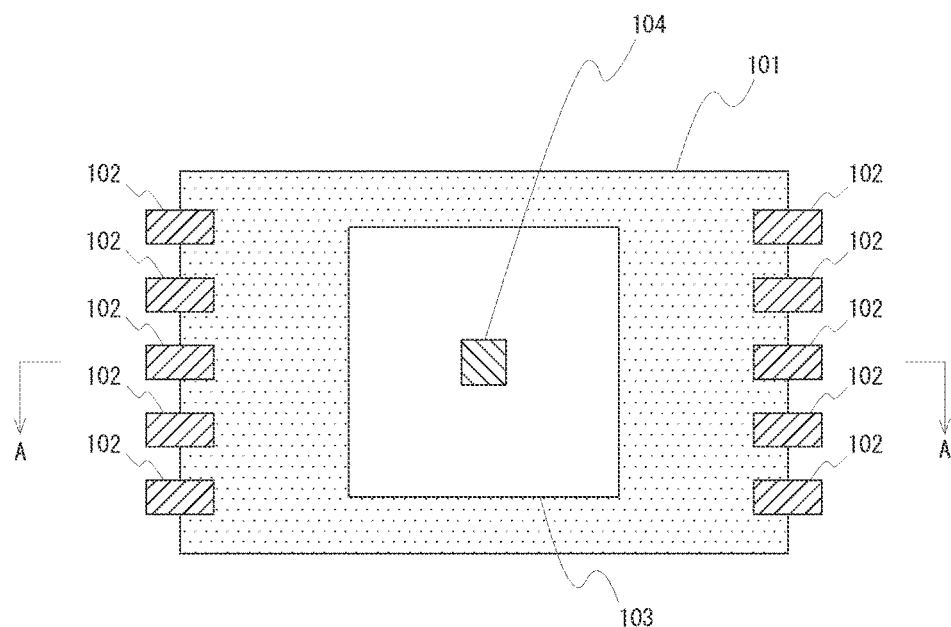
FIG. 1A is a top view in one manufacturing step of a semiconductor device according to one embodiment of the present invention.
Figure 1B:
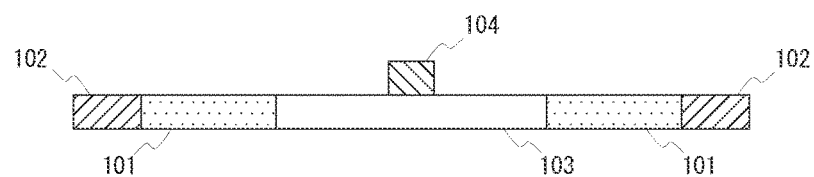
FIG. 1B is a cross-sectional side view in one manufacturing step of the semiconductor device according to one embodiment of the present invention.

FIGS. 1A and 1B respectively shows a top view and a cross-sectional side view in one manufacturing step of a semiconductor device according to one embodiment of the present invention.

A semiconductor device according to one embodiment of the present invention includes a package main body 101, a plurality of leads 102 arranged on the package main body 101, and a semiconductor element 104. The semiconductor element 104 is fixed on an island 103 arranged on an upper surface of the package main body 101. In the following description, a metal (first metal) is mainly used to fix the semiconductor element 104 to the island 103. The metal to use is preferably a metal having a low melting point. For example, the metal to use can be solder.

In order to fix the semiconductor element 104 to the island 103, a molten metal (e.g., solder) is placed at a position where the semiconductor element 104 is to be fixed on the island 103, and the semiconductor element 104 is placed on the molten metal. Alternatively, a solid metal is placed on the island 103, the metal is melted by warming and pressurization, and the semiconductor element 104 is placed on the molten metal.

Figure 1C:
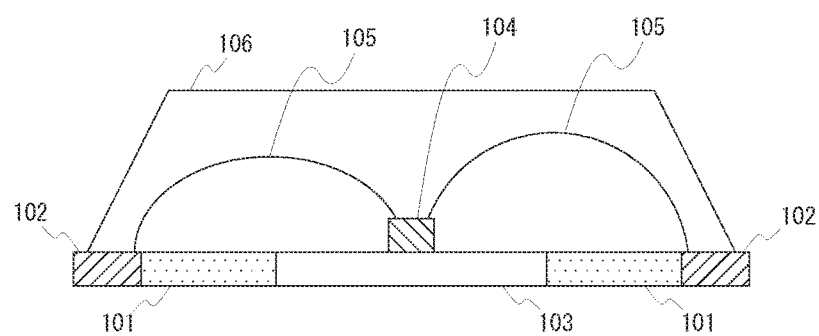
FIG. 1C is a cross-sectional side view in another manufacturing step of the semiconductor device according to one embodiment of the present invention.

FIG. 1C shows a cross-sectional side view in a subsequent step of the semiconductor device according to one embodiment of the present invention. As shown in FIG. 1C, the semiconductor element 104 and the lead 102 can be electrically connected using a wire bonding 105. After the semiconductor element 104 and the lead 102 are electrically connected, sealing is performed using a resin material and the like as a sealing material 106.

Figure 2A:
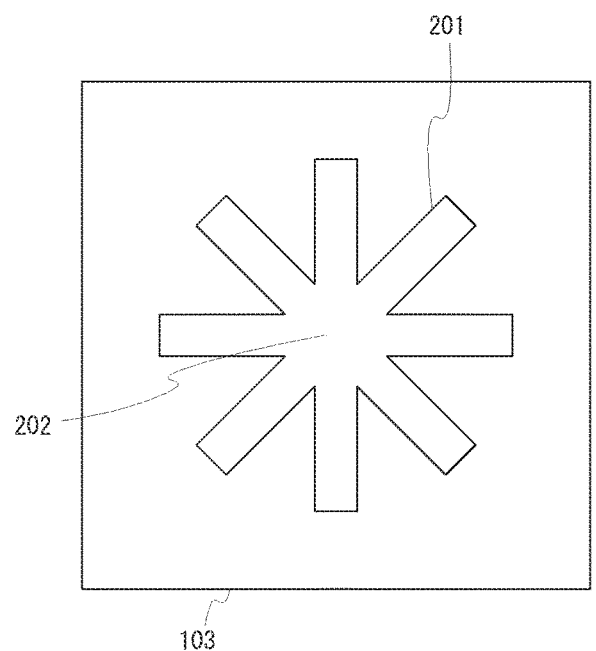
FIG. 2A shows one example of a pattern on an island of the semiconductor device according to one embodiment of the present invention.

FIG. 2A shows one example of a pattern on the island 103 of the semiconductor device according to one embodiment of the present invention. In particular, FIG. 2A is a top view of before fixing the semiconductor element 104 to the island 103.

As shown in FIG. 2A, a pattern (first pattern) 201 having a shape in which a plurality of rectangular patterns is intersected while differing the directions thereof is arranged on the island 103. In FIG. 2A, the pattern 201 has a shape in which four rectangular patterns are intersected while differing the directions by 45 degrees. In other words, the radial pattern 201 is formed on the island 103. The number of rectangular patterns is not limited to four. Furthermore, the shape and size of the rectangle do not necessarily need to be the same, and may be different. The surface of the pattern 201 is made from a material that has a higher wetting characteristic than the wetting characteristic of the surface of the island 103 not formed with the pattern 201 when the metal used to fix the semiconductor element 104 to the island 103 is melted. In other words, the affinity of the metal used to fix the semiconductor element 104 to the island 103 is higher at the surface of the pattern 201 than at the surface of the island 103.

If the width of each of the plurality of rectangular patterns configuring the shape of the pattern 201 can be ignored compared to the length, the pattern 201 can have a shape in which a plurality of line segments (linear patterns) intersected while differing the directions.

The pattern 201 is arranged in a region of one part of the island 103. That is, the entire island 103 will not be covered by the pattern 201. Furthermore, in FIG. 2A, the pattern 201 may be shaped to a concave shape.

When the metal used to fix the semiconductor element 104 to the island 103 is the solder, the pattern 201 can be formed using the metal (second metal), for example, silver. In this case, the pattern 201 can be formed by performing silver plating on the island 103. Alternatively, the pattern 201 can also be formed by vapor depositing silver on the island 103.

Figure 2B:
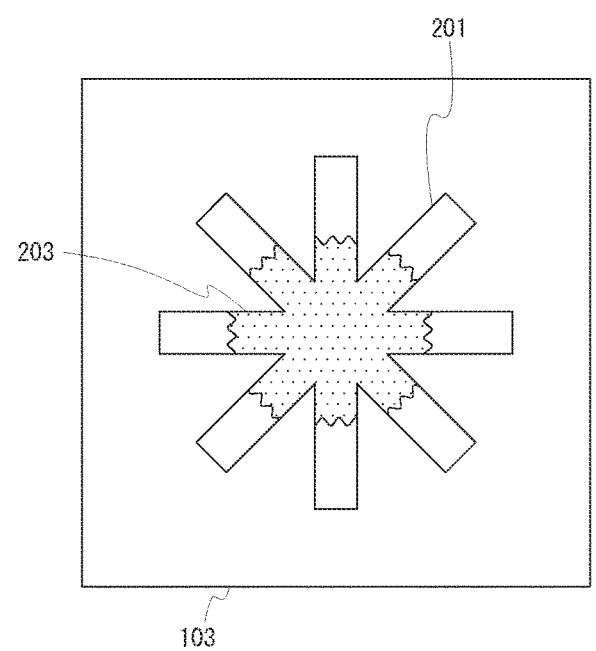
FIG. 2B shows one example in which the molten solder is placed on the island of the semiconductor device according to one embodiment of the present invention.

When the molten solder is used to fix the semiconductor element 104 to the island 103, the molten solder is placed at an intersecting position 202 of the pattern 201 (or intersection of a plurality of rectangular patterns or line segments configuring the pattern 201). The molten solder is then spread from the intersecting position 202 toward the end of the rectangular pattern or the line segment of the pattern 201, as shown in FIG. 2B. Furthermore, since the molten solder has a good wetting characteristic with respect to the surface of the pattern 201 than to the surface of the island 103, the molten solder can be prevented from substantially spreading other than to the pattern 201. Thus, as shown in FIG. 2B, the molten solder forms a sub-pattern 203 on the pattern 201.

A solid solder can be arranged at the intersecting position 202 of the pattern 201, and molten by carrying out warming and pressurization.

Thereafter, the semiconductor element 104 is arranged at the intersecting position 202 of the pattern 201, and the molten solder is solidified to fix the semiconductor element 104 to the island 103. The semiconductor element 104 does not need to be strictly arranged at the intersecting position 202 of the pattern 201.

The pattern 201 is provided on the island 103 in the present embodiment in the above manner. The pattern 201 is made from a material that has a higher wetting characteristic than the wetting characteristic of the surface of the island 103 not formed with the pattern 201 when the metal used to fix the semiconductor element 104 to the island 103 is melted.

Thus, when the molten metal is arranged on the pattern 201, the molten metal spreads on the pattern 201. Therefore, the flowing direction and the spreading manner of the molten metal can be controlled. Thus, the occurrence of contamination and the occurrence of defect of the electrical characteristics caused by the molten metal flowing out from the island can be prevented.

Furthermore, the necessity for etching the surface of the island 103 to form recesses and grooves on the surface of the islands 103 for limiting the range the molten metal spreads and the like is eliminated. Therefore, the surface of the island 103 can be flattened. The surface of the island 103 may be etched to form a groove having a concave-shaped pattern as shown in FIG. 2A, and a metal (second metal) film, for example, a silver film may be formed in such groove by plating, vapor deposition, and the like to obtain the pattern 201.

Figure 2C:
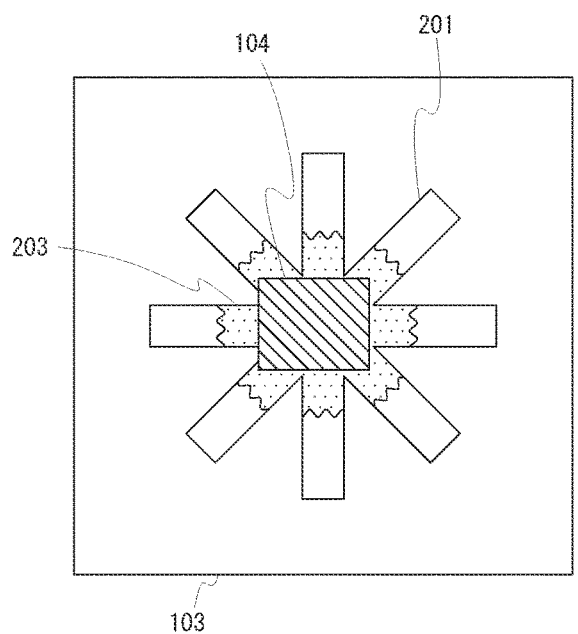
FIG. 2C shows one example in which the semiconductor element is fixed using the solder on the island of the semiconductor device according to one embodiment of the present invention.

Furthermore, as shown in FIG. 2C, the semiconductor element 104 can be more reliably fixed by locating the corner of the semiconductor element 104 on the sub-pattern 203.

Second Embodiment

Figure 3A:
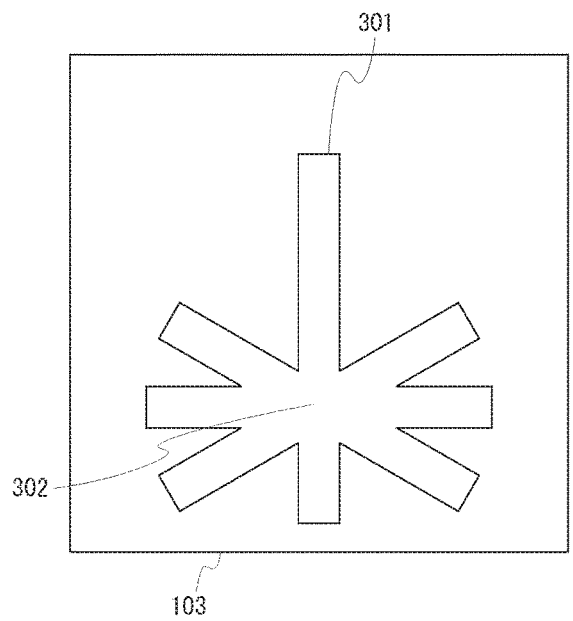
FIG. 3A shows one example of a pattern on the island of the semiconductor device according to one embodiment of the present invention.

FIG. 3A shows one example of a pattern on the island 103 of the semiconductor device according to one embodiment of the present invention.

As shown in FIG. 3A, a pattern 301 having a shape in which a plurality of rectangular patterns is intersected while differing the directions thereof is arranged on the island 103. The material and the manner of forming the pattern 301 are similar to the first embodiment. However, as opposed to the first embodiment, an intersecting position (intersection of a plurality of rectangular patterns configuring the pattern 301) 302 of the pattern 301 is offset from the center of the island 103. If the shape of the island 103 is a square, a rectangle, or a parallelogram, the center of the island 103 is the intersection of the diagonal lines. If the shape of the island 103 is not a parallelogram (i.e. if the shape of the island 103 has a shape other than parallelogram, such as a trapezoidal), the center of the island 103 can be defined as, for example, the center of gravity and the like of the shape of the island 103.

Figure 3B:
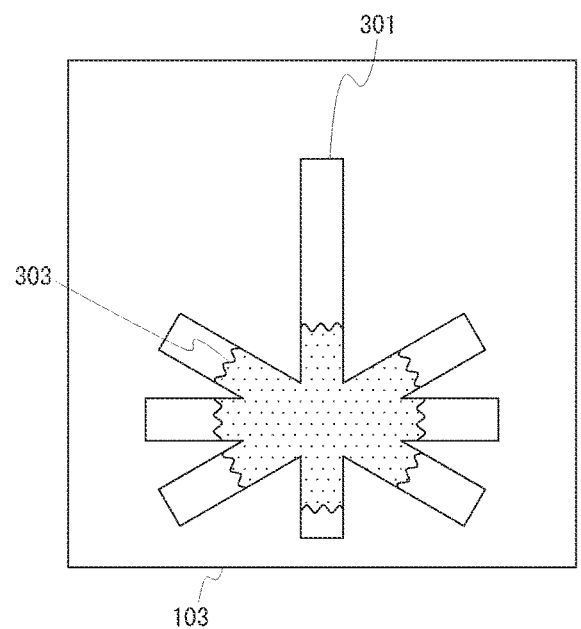
FIG. 3B shows one example in which the molten solder is placed on the island of the semiconductor device according to one embodiment of the present invention.

The procedure for fixing the semiconductor element 104 to the island 103 is also similar to the first embodiment. In other words, the molten solder is placed at an intersecting position 302 of the pattern 301. As shown in FIG. 3B, the molten solder then spreads from the intersecting position 302 of the pattern 301 toward the end on the pattern 301 to form a sub-pattern 303.

Figure 3C:
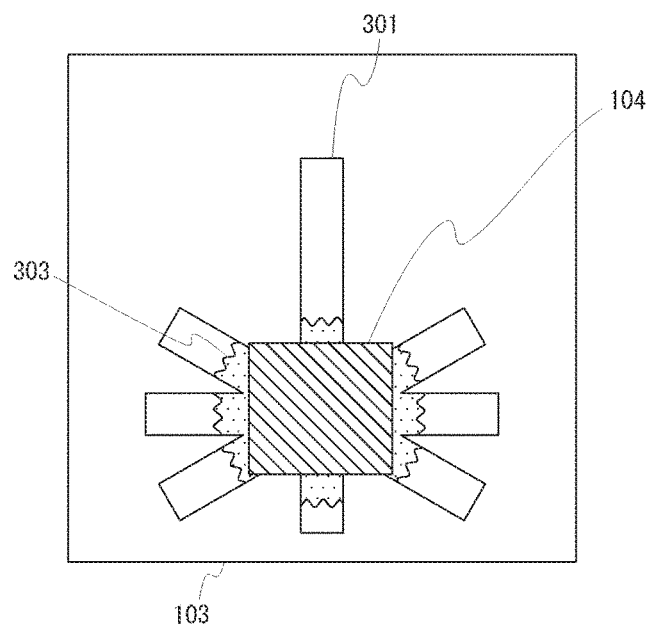
FIG. 3C shows one example in which the semiconductor element is fixed using the solder on the island of the semiconductor device according to one embodiment of the present invention.

Thereafter, as shown in FIG. 3C, the semiconductor element 104 is placed at the intersecting position 302 of the pattern 301, and the molten solder is solidified to fix the semiconductor element 104 to the island 103.

Therefore, in the present embodiment, the semiconductor element 104 can be fixed to other than the center of the island 103. Furthermore, the intersecting position 302 of the pattern 301 can be offset from the center of the island 103 so that a length extending in one direction of one of the rectangular patterns configuring the pattern 301 is made longer than a length extending in another direction. Therefore, the solder can be flowed more in one direction in the relevant rectangular pattern and the amount of solder does not need to be strictly adjusted.

Third Embodiment

Figure 4A:
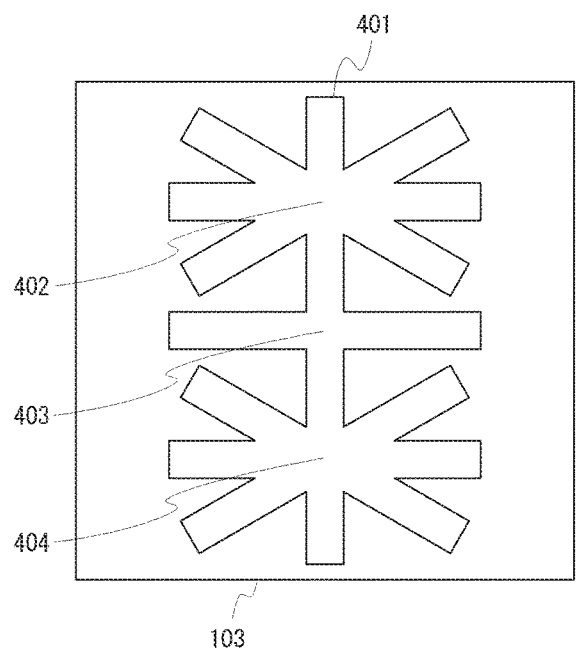
FIG. 4A shows one example of a pattern on the island of the semiconductor device according to one embodiment of the present invention.

FIG. 4A shows one example of a pattern on the island 103 of the semiconductor device according to one embodiment of the present invention.

As shown in FIG. 4A, a pattern 401 having a shape in which a plurality of rectangular patterns is intersected while differing the directions thereof is arranged on the island 103. The material and the manner of forming the pattern 401 are similar to the first embodiment. However, as opposed to the first and second embodiments, a plurality of intersecting positions 402, 403, 404, where a plurality of rectangular patterns intersects, exists on the pattern 401. The two intersecting positions 402, 404 are offset from the center of the island 103.

Figure 4B:
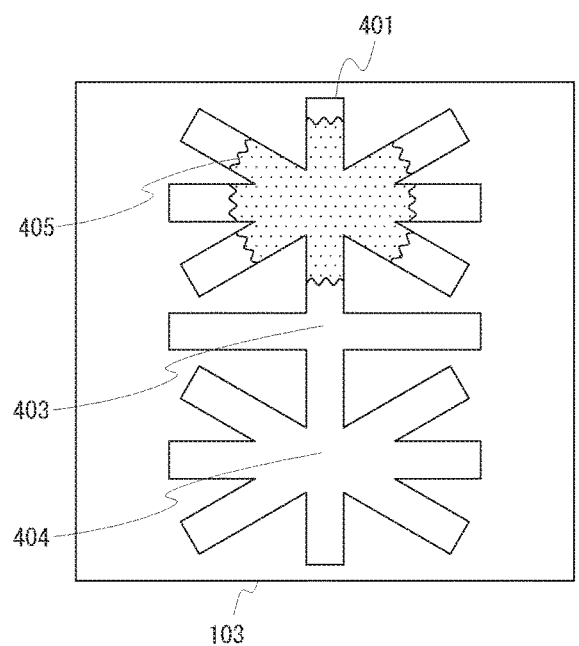
FIG. 4B shows one example in which the molten solder is placed on the island of the semiconductor device according to one embodiment of the present invention.

The procedure for fixing the semiconductor device 104 to the island 103 is also similar to the first and second embodiments. In other words, the molten solder is placed at an intersecting position 402 of the pattern 401. The molten solder then spreads from the intersecting position 402 of the pattern 401 to form a sub-pattern 405, as shown in FIG. 4B.

Figure 4C:
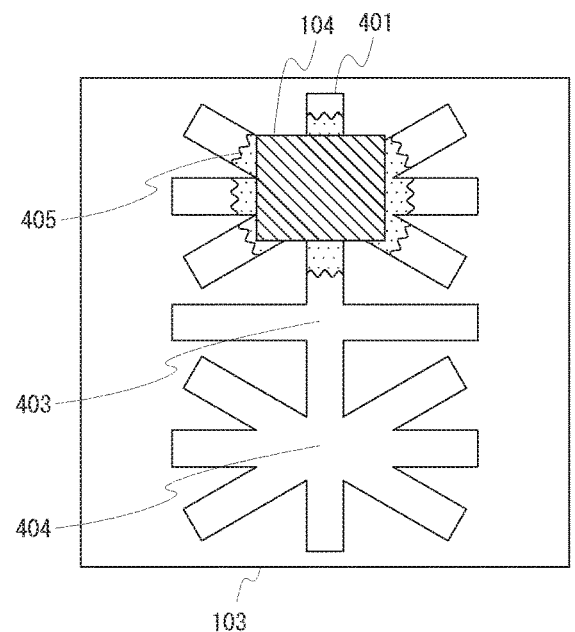
FIG. 4C shows one example in which the semiconductor element is fixed using the solder on the island of the semiconductor device according to one embodiment of the present invention.

Thereafter, as shown in FIG. 4C, the semiconductor element 104 is placed at the intersecting position 402 of the pattern 401, and the molten solder is solidified to fix the semiconductor element 104 to the island 103.

In the present embodiment, the fixing position of the semiconductor element 104 is not limited to the intersecting position 402. Since the intersecting positions 402, 403, 404 exist in the pattern 401, the molten solder may be placed at the intersecting position 404 to fix another semiconductor element. Furthermore, the molten solder may be placed at the intersecting position 403 to fix another further semiconductor element. Moreover, the semiconductor element may be fixed at two or more of intersecting positions 402, 403 and 404 respectively.

According to the present embodiment, a plurality of semiconductor elements can be fixed as the pattern has a plurality of intersecting positions.

Fourth Embodiment

Figure 5A:
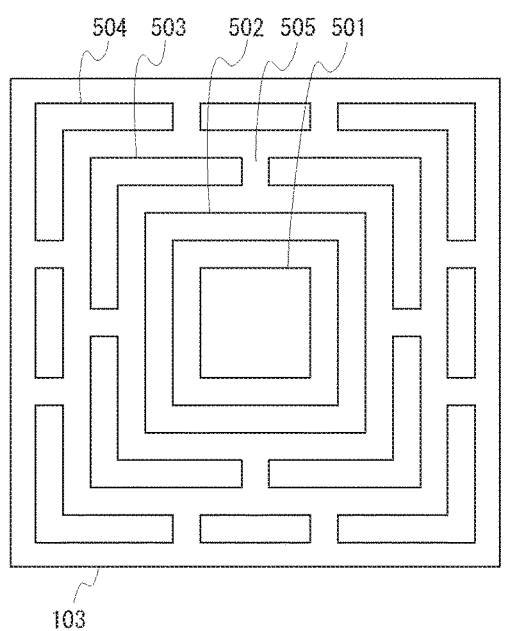
FIG. 5A shows one example of a pattern on the island of the semiconductor device according to one embodiment of the present invention.

In the first to third embodiments, the pattern on the island 103 has a shape in which a plurality of rectangular patterns is intersected while differing the directions thereof. However, in the present invention, the shape of the pattern on the island 103 is not limited to the shape of the pattern in the first to third embodiments. For example, as shown in FIG. 5A, a square or rectangular pattern 501 is arranged at the center of the island 103. Additionally, a pattern 502 surrounding the square or rectangular pattern 501 is arranged at the periphery of the square or rectangular pattern 501. Furthermore, L-shaped patterns 503, 504 are arranged at the periphery of the square and rectangular pattern 501 and the pattern 502 surrounding the same. A linear pattern also may be arranged between the L-shaped patterns. In this case, a pattern may be prevented from being formed in a portion 505 excluding the square or rectangular pattern 501 and the pattern 502 surrounding the same, the L-shaped patterns 503, 504, or a linear pattern.

Figure 5B:
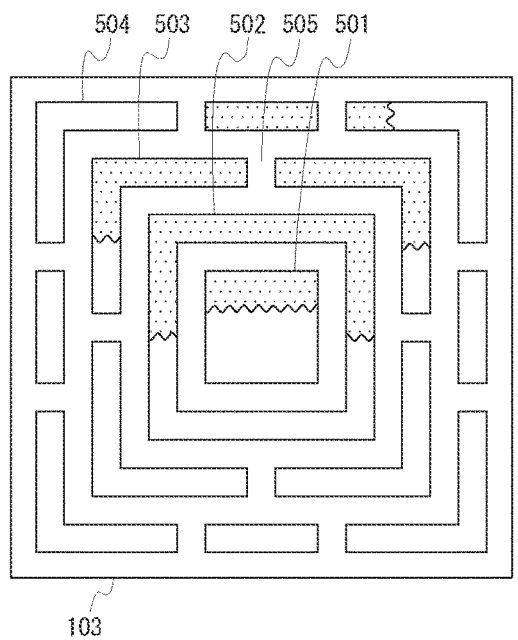
FIG. 5B shows one example in which the molten solder is placed on the island of the semiconductor device according to one embodiment of the present invention.
Figure 5C:
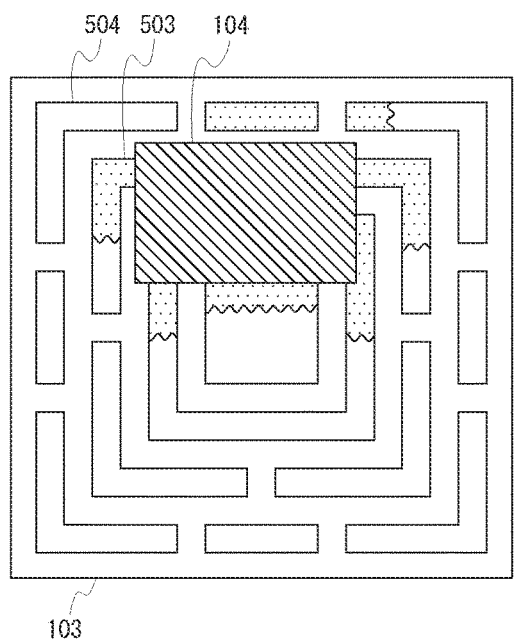
FIG. 5C shows one example in which the semiconductor element is fixed using the solder on the island of the semiconductor device according to one embodiment of the present invention.

In the present embodiment, the molten solder can be placed at an arbitrary location on the pattern 501, 502, 503 or 504 on the island 103 to fix the semiconductor element 104 to the island 103. As shown in FIG. 5B, the molten solder is then dispersed to a plurality of patterns thus forming dispersed sub-patterns. Then, as shown in FIG. 5C, the semiconductor element 104 is arranged on the dispersed sub-pattern.

Therefore, in the present embodiment, the semiconductor element 104 can be fixed at an arbitrary position on the pattern of the island 103. In this case, the proportion of the area on the island 103 occupied by the pattern can be increased, and the solder can be prevented from spreading more than necessary.

Fifth Embodiment

Figure 6A:
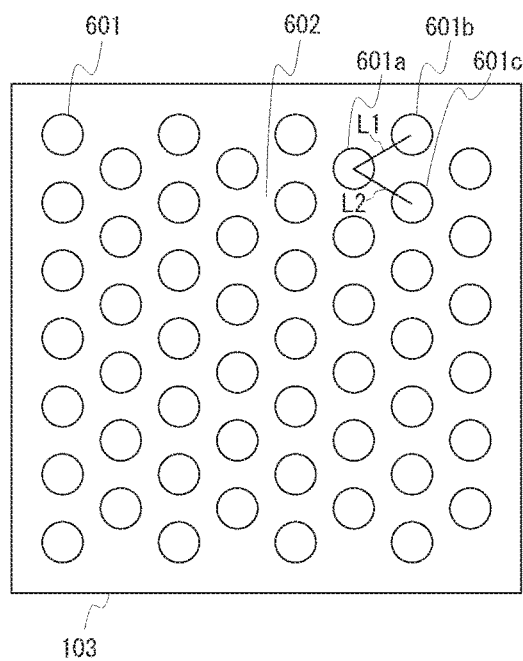
FIG. 6A shows one example of a pattern on the island of the semiconductor device according to one embodiment of the present invention.

In the present invention, the pattern on the island 103 is not limited to a linear shape and a combination thereof such as a square shape, a rectangular shape, an L-shape, or a linear shape. A pattern in which a plurality of circular patterns 601 is arranged may be arranged. In this case, for example, the plurality of circular patterns 601 may each be arranged on a plurality of straight lines parallel to each other and at equal interval. Additionally, as shown in FIG. 6A, the plurality of circular patterns 601 may be arranged so that a length of a liner segment L1 joining a center of a circular pattern 601a and that of another circular pattern 601b which is arranged adjacent to the circular pattern 601a and a length of another liner segment L2 joining the center of the circular pattern 601a and that of another circular pattern 601c which is arranged adjacent to the circular pattern 601a are the same, and so that extension lines of the two liner segments L1, L2 intersect at other than 90 degrees. Alternatively, the extension lines of the two liner segments L1, L2 may intersect at 90 degrees. Furthermore, in FIG. 6A, reference numeral 602 represents a portion of the island 103 where the pattern 601 is not formed.

Figure 6B:
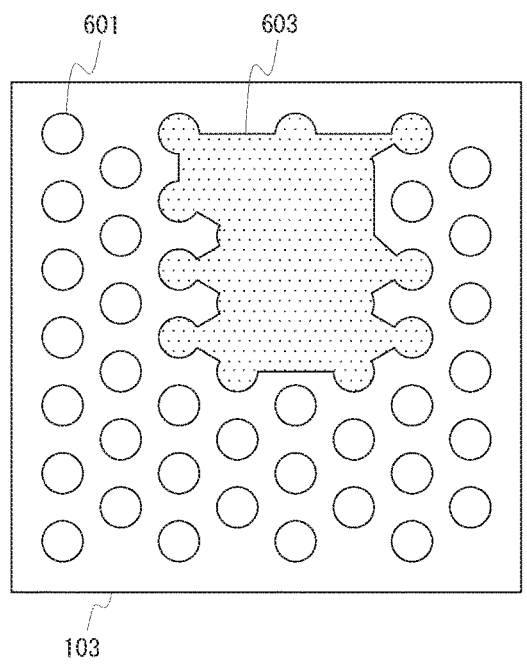
FIG. 6B shows one example in which the molten solder is placed on the island of the semiconductor device according to one embodiment of the present invention.
Figure 6C:
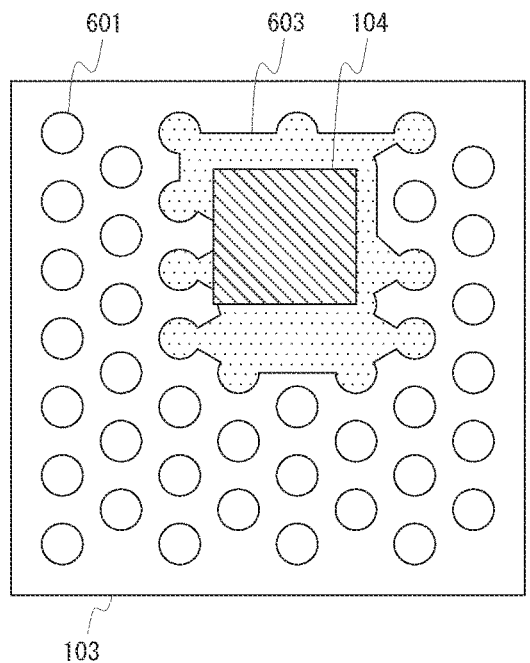
FIG. 6C shows one example in which the semiconductor element is fixed using the solder on the island of the semiconductor device according to one embodiment of the present invention.

In the present embodiment, the molten solder can be placed at an arbitrary location on the pattern 601 of the island 103 to fix the semiconductor element 104 to the island 103. The molten solder then spreads so as to be absorbed by the circular patterns 601 even if placed at a portion including the portion 602, thus forming a sub-pattern 603, as shown in FIG. 6B. Thereafter, the semiconductor element 104 can be fixed on the sub-pattern 603 as shown in FIG. 6C.

According to the present embodiment, the semiconductor element 104 can be fixed at an arbitrary position of the island 103. The solder can be prevented from spreading more than necessary by arranging greater number of circular patterns 601.

Sixth Embodiment

Figure 7:
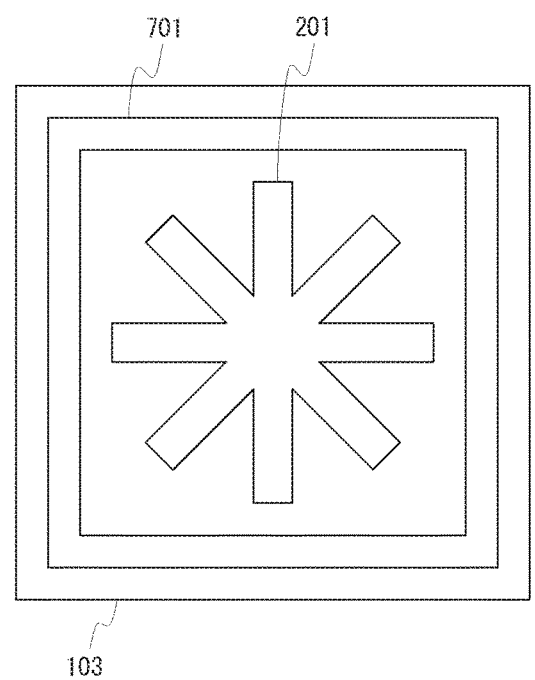
FIG. 7 shows one example of a pattern on the island of the semiconductor device according to one embodiment of the present invention.

FIG. 7 shows one example of a pattern on the island 103 of the semiconductor device according to one embodiment of the present invention. In FIG. 7, the periphery of the pattern 201 is surrounded by another pattern (second pattern) 701. In other words, the pattern 201 of the first embodiment is arranged in a region surrounded by the pattern 701. In FIG. 7, the pattern of the first embodiment has been shown for the pattern 201, but an arbitrary pattern, for example, one or a combination of patterns of the second to fifth embodiments may be used in place of the pattern 201.

Furthermore, the molten solder is placed in a region surrounded by the pattern 701 to fix the semiconductor element, as described in the first to fifth embodiments.

In the present embodiment, the solder can be prevented from overflowing from the island 103 as the solder is spread to another pattern 701 even if the solder is overspread.

Other Embodiments

A case of fixing the semiconductor element on the island using a metal (e.g., solder) has been described above. However, the present invention is not limited to a case of using the metal, and can also be used for a case of fixing the semiconductor element to the island using an adhesive. In this case, a pattern is formed on the island with a material having a high affinity with respect to the adhesive than the affinity with respect to the adhesive of the surface of the island.

What is claimed is:

1. A semiconductor device comprising:
   a semiconductor element;
   an island having a surface on which the semiconductor element is fixed using a first metal; and
   a first pattern formed by a second metal, the first pattern being arranged on one part of the surface,
   wherein the second metal has a greater wetting characteristic than the surface when the first metal is melted.

2. The semiconductor device according to claim 1, wherein the first metal is a solder, and the second metal is a silver.

3. The semiconductor device according to claim 1, wherein the first pattern is formed by plating the second metal.

4. The semiconductor device according to claim 1, wherein the first pattern has a radial shape in which a plurality of rectangular patterns or linear patterns is intersected while differing directions.

5. The semiconductor device according to claim 4, wherein the first pattern is a pattern in which a position where the plurality of rectangular patterns or linear patterns intersects is offset from a center of the island.

6. The semiconductor device according to claim 4, wherein the first pattern has the plurality of rectangular patterns or the linear patterns intersected at a plurality of positions while differing directions.

7. The semiconductor device according to claim 1, wherein the first pattern includes a plurality of patterns of different shapes.

8. The semiconductor device according to claim 7, wherein the first pattern includes an L-shaped pattern and a square or rectangular pattern.

9. The semiconductor device according to claim 1, wherein the first pattern includes a plurality of circular patterns.

10. The semiconductor device according to claim 9, wherein the first pattern is a pattern in which a length of a liner segment joining a center of a certain circular pattern and that of another circular pattern which is arranged adjacent to the certain circular pattern and a length of another liner segment joining the center of the certain circular pattern and that of still another circular pattern which is arranged adjacent to the certain circular pattern are the same, and so that extension lines of the two liner segments are intersect other than the 90 degrees.

11. The semiconductor device according to claim 1, further comprising a second pattern made from the second metal that surrounds the first pattern.

* * * * *